United States Patent
Audebert et al.

(10) Patent No.: US 10,644,690 B2
(45) Date of Patent: May 5, 2020

(54) ELEMENTARY ELECTRONIC CIRCUIT FOR STAGE OF AMPLIFICATION OR REPEAT OF ANALOG SIGNALS

(71) Applicants: Commissariat à l'Énergie Atomique et aux Énergies Alternatives, Paris (FR); UNIVERSITE DE NICE SOPHIA ANTIPOLIS, Nice (FR)

(72) Inventors: Patrick Audebert, Varces-Allieres-et-Risset (FR); Emeric De Foucauld, Coublevie (FR); Yves Leduc, Roquefort les Pins (FR); Gilles Jacquemod, Antibes (FR); Zhaopeng Wei, Nice (FR); Philippe Lorenzini, Antibes (FR)

(73) Assignees: Commissariat à l'Énergie Atomique et aux Énergies Alternatives, Paris (FR); UNIVERSITE DE NICE SOPHIA ANTIPOLIS, Nice (FR)

( * ) Notice: Subject to any disclaimer, the term of this patent is extended or adjusted under 35 U.S.C. 154(b) by 0 days.

(21) Appl. No.: 15/757,972

(22) PCT Filed: Sep. 21, 2016

(86) PCT No.: PCT/FR2016/052394
§ 371 (c)(1),
(2) Date: Mar. 6, 2018

(87) PCT Pub. No.: WO2017/055709
PCT Pub. Date: Apr. 6, 2017

(65) Prior Publication Data
US 2018/0254775 A1 Sep. 6, 2018

(30) Foreign Application Priority Data

Sep. 28, 2015 (FR) .................................. 15 59116

(51) Int. Cl.
*H03K 17/082* (2006.01)
*G05F 3/20* (2006.01)
*G05F 3/26* (2006.01)

(52) U.S. Cl.
CPC ......... *H03K 17/0822* (2013.01); *G05F 3/205* (2013.01); *G05F 3/262* (2013.01); *H03K 2217/0018* (2013.01)

(58) Field of Classification Search
CPC ... H03K 17/08; H03K 17/082; H03K 17/0822
See application file for complete search history.

(56) References Cited

U.S. PATENT DOCUMENTS

| | | | |
|---|---|---|---|
| 5,103,277 A | 4/1992 | Caviglia et al. | |
| 8,570,096 B2 * | 10/2013 | Le Coz | H03K 19/0013 327/534 |

(Continued)

FOREIGN PATENT DOCUMENTS

| | | |
|---|---|---|
| EP | 2 141 741 A2 | 1/2010 |
| WO | WO 99/29040 A1 | 6/1999 |

OTHER PUBLICATIONS

International Search Report for Application No. PCT/FR2016/052394 dated Jan. 17, 2017.

(Continued)

*Primary Examiner* — Hai L Nguyen
(74) *Attorney, Agent, or Firm* — Wolf, Greenfield & Sacks, P.C.

(57) ABSTRACT

An electronic circuit includes at least one first multi-gate transistor including a first gate and a second gate different from the first gate; and a regulation unit designed to measure a variable representing the drain-source voltage of the first transistor and to apply a polarization potential as a function of the variable to the second gate of the first transistor.

17 Claims, 7 Drawing Sheets

(56) References Cited

U.S. PATENT DOCUMENTS

2004/0104760 A1   6/2004  Ando
2004/0135621 A1   7/2004  Sumita et al.

OTHER PUBLICATIONS

Written Opinion for Application No. PCT/FR2016/052394 dated Jan. 17, 2017.

\* cited by examiner

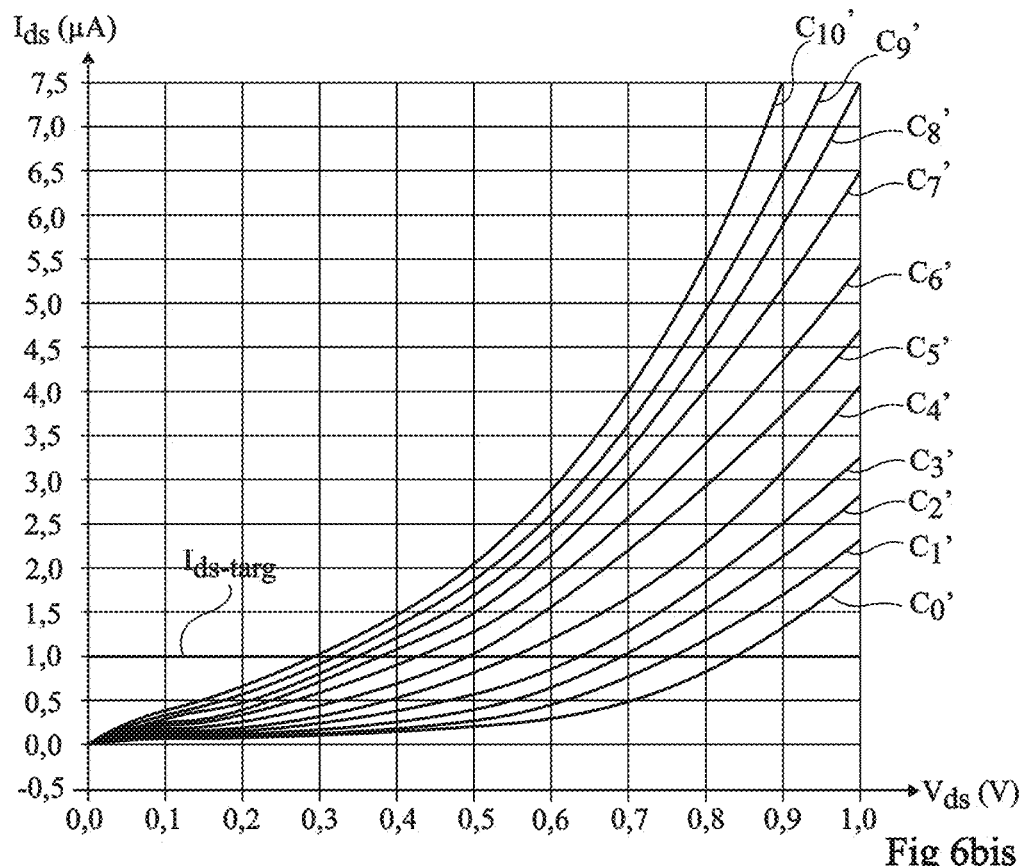
Fig 6bis
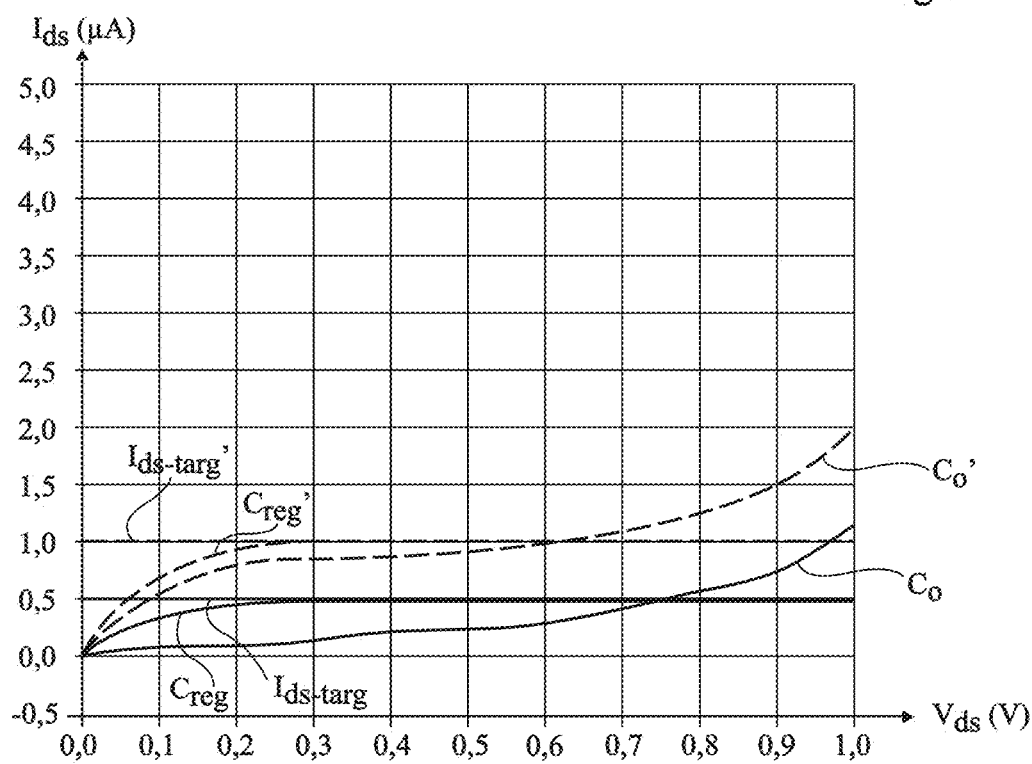
Fig 8bis

ELEMENTARY ELECTRONIC CIRCUIT FOR STAGE OF AMPLIFICATION OR REPEAT OF ANALOG SIGNALS

CROSS-REFERENCE TO RELATED APPLICATIONS

This application is the national phase of International Application No. PCT/FR2016/052394 filed on Sep. 21, 2016, which claims priority to French Patent Application No. 15/59116, filed on Sep. 28, 2015, both of which applications are incorporation herein by reference to the maximum extent allowable.

DISCUSSION OF THE RELATED ART

Many electronic circuits, for example, voltage amplifiers or current mirrors, comprise at least one MOS transistor used in saturation state to amplify or copy an analog signal. A potential representative of the input signal to be amplified or to be copied is generally applied to the gate or to the source of the transistor, and an output signal, which is an image of the input signal, is supplied on a source or drain node of the transistor.

FIG. 1 is an electric diagram of an example of a voltage amplification circuit comprising a MOS transistor T1 used in saturation state. In the shown example, transistor T1 is an N-channel transistor having its source (s) coupled to a node of application of a low power supply potential GND, for example, the ground, and having its drain (d) coupled to a node of application of a high power supply potential VDD greater than low power supply potential GND via a resistive load R, for example, a resistor or a MOS transistor biased in saturation state.

In operation, an input voltage $v_i$ to be amplified (referenced to node GND in this example), is applied to the gate (g) of transistor T. Provided for the frequency of signal $v_i$ to be lower than the cut-off frequency of the circuit and for the amplitude of signal $v_i$ to remain limited, the assembly of FIG. 1 provides, on the drain (d) of transistor T1, an output voltage $v_o$ (referenced to node GND in this example), which is an amplified image of voltage $v_i$. In small signals, voltage gain $G_v = v_o/v_i$ of the circuit is equal to product $-G_m \cdot R$, $G_m$ being the transconductance of transistor T1 biased in saturation state, and R being the resistance of load R. To obtain the desired amplification function, output voltage $v_o$ should be in the range between the minimum drain-source voltage $V_{dssat}$ required to ensure the operation in saturation state of transistor T1 and voltage $VDD-V_R$, $V_R$ being the voltage across load R.

FIG. 2 is an electric diagram of an example of a current copying circuit, comprising a MOS transistor T1 used in saturation state. In the shown example, transistor T1 is an N-channel transistor having its source (s) coupled to a node of application of a low power supply potential GND, for example, the ground. The circuit of FIG. 2 further comprises a MOS transistor T2, for example, identical to transistor T1. Transistors T1 and T2 are assembled as a current mirror, transistor T2 forming the input branch of the mirror, and transistor T1 forming the output branch of the mirror. The source (s) of transistor T2 is coupled to the source (s) of transistor T1, the gate (g) of transistor T2 is coupled to the gate (g) of transistor T1, and the drain (d) of transistor T2 is coupled to the gate (g) of transistor T2.

In operation, an input current $i_i$ to be copied is applied to the drain (d) of input transistor T2. The gate (g) of transistor T2 self-biases so that transistor T2 absorbs input current $i_i$. Output transistor T1 being biased to the same gate-source voltage as input transistor T2, transistor T1 conducts an output current $i_o$ substantially identical to input current $i_i$ or, if transistors T1 and T2 have different dimensions, an output current $i_o$ proportional to input current $i_i$.

A problem which is posed in circuits of the type described in relation with FIGS. 1 and 2, and, more generally, in any circuit using a MOS transistor operating in saturation state to copy or amplify an analog signal, lies in the fact that, generally, the output conductance of a MOS transistor is relatively high, and varies according to the drain-source voltage or output voltage of the transistor. This results in limited performances, particularly in terms of gain for amplification circuits, or in terms of accuracy of the copy for current copying circuits.

Thus, there is a need for an elementary circuit behaving as a MOS transistor but having, in saturation state, a relatively low output conductance substantially independent from its output voltage.

To achieve this, it has already been provided to use a so-called cascode assembly, formed of a series association of two MOS transistors operating in saturation state, one of the two transistors being assembled with a common gate, that is, receiving on its gate a constant bias potential, copying its source current on its drain, and the other transistor receiving on its gate a potential representative of the input signal to be amplified or to be copied. A disadvantage of the cascode assembly however is that it comprises two transistors in series, where the two transistors should be maintained biased in saturation state to guarantee the proper operation of the circuit. This results in an increase in the minimum value of the output voltage for which the proper operation of the circuit is guaranteed, and thus in a decrease of the output signal excursion range where the proper operation of the circuit is guaranteed. This particularly raises a problem for circuits formed in advanced technological processes, where power supply voltage VDD is relatively low, typically in the range from 1 to 2 volts, which already significantly limits, for the high value, the output signal excursion range.

SUMMARY

Thus, an embodiment provides an electronic circuit comprising: at least one first multi-gate MOS transistor comprising a first gate and a second gate different from the first gate; and a regulation unit capable of measuring a quantity representative of the drain-source voltage of the first transistor and of applying to the second gate of the first transistor a bias potential which is a function of said quantity.

According to an embodiment, the variations of the bias potential applied by the regulation unit according to the variations of the drain-source voltage of the first transistor follow a law selected so that, in saturation state, the output conductance of the first transistor is smaller than when a constant bias potential is applied to the second gate of the first transistor.

According to an embodiment, the variations of the bias potential applied by the regulation unit according to the variations of the drain-source voltage of the first transistor follow a law selected so that, in saturation state, the output conductance of the first transistor is substantially independent from its drain-source voltage.

According to an embodiment, the first transistor comprises a channel-forming region, and a source region, and a drain region laterally bordering the channel-forming region, the first gate being arranged above the channel-forming region and being insulated from the channel-forming region by an insulating layer, and the second gate being arranged under the channel-forming region.

According to an embodiment, the second gate is insulated from the channel-forming region by an insulating layer.

According to an embodiment, the first transistor is a MOS transistor of FDSOI type.

According to an embodiment, the regulation unit comprises a second MOS transistor having its gate coupled to the drain of the first transistor, having its drain coupled to a node of application of a first power supply potential by a first resistor, and having its source coupled to a node of application of a second power supply potential different from the first power supply potential by a second resistor.

According to an embodiment, the regulation unit comprises digital circuits.

According to an embodiment, the circuit comprises a plurality of first multi-gate MOS transistors each comprising a first gate and a second gate different from the first gate, wherein the regulation unit is capable of measuring, for each first transistor, a quantity representative of the drain-source voltage of the transistor, and of applying to the second gate of each first transistor a bias potential which is a function of one or a plurality of said quantities.

According to an embodiment, the regulation unit comprises a calibration unit capable of determining the law of the variations to be applied to the bias potential according to the variations of the drain-source voltage of the first transistor so that, in saturation state, the output conductance of the first transistor is smaller than when a constant bias potential is applied to the second gate of the first transistor.

According to an embodiment, the regulation unit comprises a calibration unit capable of determining the law of the variations to be applied to the bias potential according to the variations of the drain-source voltage of the first transistor so that, in saturation state, the output conductance of the first transistor is substantially independent from its drain-source voltage.

According to an embodiment, the regulation unit is reconfigurable, the calibration unit being capable of configuring the regulation unit to apply the determined law.

Another embodiment provides an analog signal amplification circuit comprising at least one circuit of the above-mentioned type.

Another embodiment provides a current copying circuit comprising at least one circuit of the above-mentioned type.

Another embodiment provides a differential signal amplification or copying circuit comprising at least one circuit of the above-mentioned type.

BRIEF DESCRIPTION OF THE DRAWINGS

The foregoing and other features and advantages will be discussed in detail in the following non-limiting description of specific embodiments in connection with the accompanying drawings, among which:

FIGS. 6*bis* and 8*bis* are diagrams respectively corresponding to FIGS. 6 and 8 and illustrating the operation of the circuit of FIG. 3 for another operating point of the MOS transistor;

DETAILED DESCRIPTION

Figure 1:
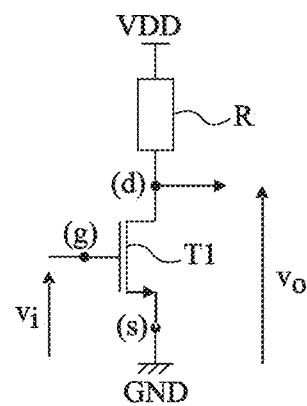
FIG. 1, previously described, is an electric diagram of an example of a voltage amplification circuit.

The same elements have been designated with the same reference numerals in the different drawings and, further, the various drawings are not to scale. In the following description, when reference is made to terms qualifying absolute positions, such as terms "front", "back", etc., or relative positions, such as terms "above", "under", "upper", "lower", etc., or to terms qualifying directions, such as terms "horizontal", "vertical", "lateral", etc., it is referred to the orientation of the cross-section views of FIG. 4, it being understood that, in practice, the described elements may be oriented differently. Unless otherwise specified, expressions "approximately", "substantially", "about", "almost", and "in the order of" mean to within 10%, preferably to within 5%. In the present description, term "connected" is used to designate a direct electric connection, with no intermediate electronic component, for example, by means of one or a plurality of conductive tracks, and term "coupled" is used to designate either a direct electric connection (then meaning "connected") or a connection via one or a plurality of components.

Figure 3:
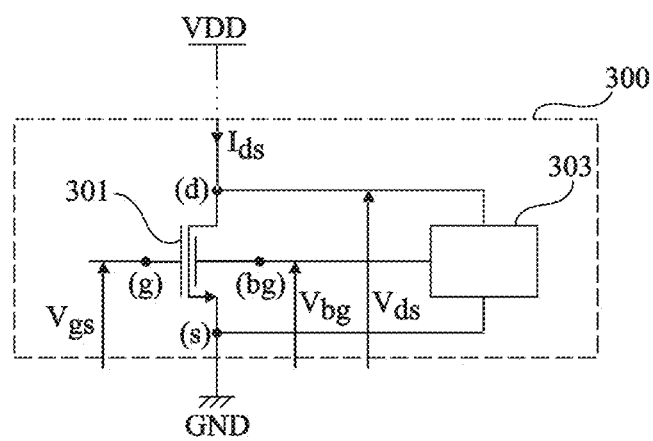
FIG. 3 is a simplified electric diagram of an example of an embodiment of an elementary circuit usable in analog signal amplification or copying circuits.

FIG. 3 is a simplified electric diagram of an embodiment of an elementary circuit 300 which may in particular be used in analog signal amplification or copying circuits, such a circuit behaving as a MOS transistor but having, in saturation state, a relatively low output conductance substantially independent from its output voltage.

Circuit 300 comprises a MOS transistor 301. In the shown example, transistor 301 is an N-channel transistor having its source (s) intended to be coupled to a node of application of a low power supply potential GND, for example, the ground (for example, a potential equal to 0 V), and having its drain (d) intended to be coupled to a node of application of a high power supply potential VDD greater than low power supply potential GND, for example, via a resistive load, not shown.

According to an aspect of an embodiment, transistor 301 is a dual-gate MOS transistor, that is, it comprises a channel-forming region (c) (FIG. 4) laterally bordered, on the one hand, with a source region (s) and, on the other hand, with a drain region (d), and it further comprises a first control gate (g) or front side gate, arranged above the channel-forming region and insulated from the channel-forming region by an insulating layer, and a second control gate (bg) or back side gate, arranged under the channel-forming region. In such a transistor, the current flowing between the drain (d) and the source (s) of the transistor is a function not only of the potential applied to the front side gate (g) of the transistor, but also of the potential applied to the back side gate (bg) thereof. In particular, the threshold voltage of the transistor, that is, the minimum voltage to be applied between the front side gate (g) and the source (s) of the transistor to turn on the transistor depends on the potential applied to the back side gate (bg) of the transistor.

Circuit 300 comprises a regulation unit 303 capable of measuring a quantity representative of the drain-source voltage of transistor 301, and of applying to the back side gate (bg) of transistor 301 a bias potential (referenced to node GND in this example) which is a function of the measured quantity. In the shown example, regulation unit 303 is connected to the source (s) and to the drain (d) of transistor 301, as well as to the back side gate (bg) of transistor 301, and is capable of measuring the drain-source voltage of transistor 301, and of applying to the back side gate (bg) of transistor 301 a bias potential which is a function of the measured drain-source voltage.

Figure 4:
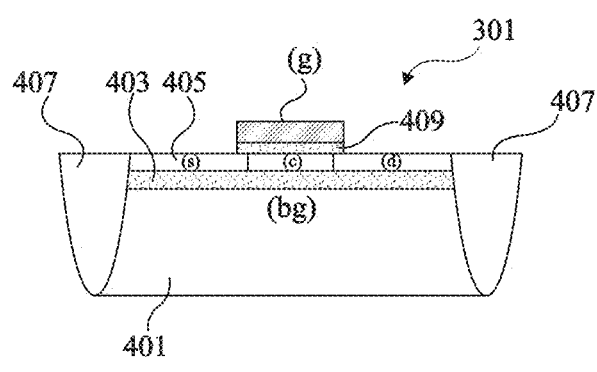
FIG. 4 is a simplified cross-section view of an embodiment of a MOS transistor of the circuit of FIG. 3.

FIG. 4 is a simplified cross-section view of an embodiment of MOS transistor 301 of the circuit of FIG. 3. In this example, transistor 301 is a transistor of SOI type ("Semiconductor On Insulator"). Transistor 301 is formed inside and on top of a structure of semiconductor on insulator type comprising a vertical stack of a semiconductor support substrate 401 coated with a layer 403 of an insulating material, layer 403 being itself coated with a semiconductor layer 405. The lower surface of semiconductor layer 405 is in contact with the upper surface of insulating layer 403 and the lower surface of insulating layer 403 is in contact with the upper surface of support substrate 401. Transistor 301 is laterally delimited by insulating trenches 407, for example, filled with oxide, extending substantially vertically from the upper surface of semiconductor layer 405, running through semiconductor layer 405 and insulating layer 403, and extending into support substrate 401, for example, all the way to the lower surface of substrate 401.

Transistor 301 comprises, in semiconductor layer 405, inside of the region delimited by trenches 407, a channel-forming region (c), as well as a source region (s) and a drain region (d) laterally bordering the channel-forming region (c). In this example, the source (s) and drain (d) regions and the channel-forming region (c) extend across the entire thickness of layer 405. The channel-forming region (c) has a conductivity type opposite to that of the source (s) and drain (d) regions. As an example, for an N-channel transistor, the channel-forming region (c) is N-type doped, and the source (s) and drain (d) regions are P-type doped. Support substrate 401 may have the same conductivity type as the channel-forming region (c) or an opposite conductivity type.

Transistor 301 comprises, above the channel-forming region (c), a control gate (g) insulated from the channel-forming region (c) by an insulating layer 409, for example, an oxide layer. The gate (g) corresponds to the front side gate of transistor 301. The lower surface of the gate (g) is in contact with the upper surface of insulating layer 409, the lower surface of insulating layer 409 being in contact with the upper surface of the channel-forming region (c).

In this example, the back side gate (bg) of transistor 301 is formed by substrate region 401 arranged under the channel-forming region (c). Thus, the back side gate (bg) is insulated from the channel-forming region (c) by layer 403.

In a preferred embodiment, transistor 301 is a FDSOI-type transistor, that is, an SOI transistor where the channel-forming region (c) is fully depleted in the absence of a biasing of the transistor. Indeed, in a FDSOI transistor, the variations of the control potential applied to the back side gate (bg) of the transistor cause significant variations of the transistor threshold voltage, and thus of the current flowing through the transistor when the latter conducts. As a result, as will more clearly appear from the following description, FDSOI transistors are particularly adapted to the forming of circuit 300 of FIG. 3. More particularly, the illustration diagrams of FIGS. 5, 6, 7, and 8, which will be described hereafter, are drawn for a transistor 301 of the type generally called UTBB-FDSOI ("Ultra Thin Body and Box Fully Depleted Silicon On Insulator") in the art, having a gate length in the order of 28 nm.

The described embodiments are however not limited to the case where transistor 301 is of SOI or FDSOI type. More generally, the described embodiments apply to any type of MOS transistors with two control gates respectively arranged on the front side and on the back side of the channel-forming region of the transistor. As an example, the described embodiments are compatible with a "bulk"-type MOS transistor 301, comprising a semiconductor bulk region arranged under the channel-forming region, having its upper surface in contact with the lower surface of the channel-forming region. In this case, the back side gate is formed by the transistor bulk region and is not insulated from the channel-forming region.

Figure 5:
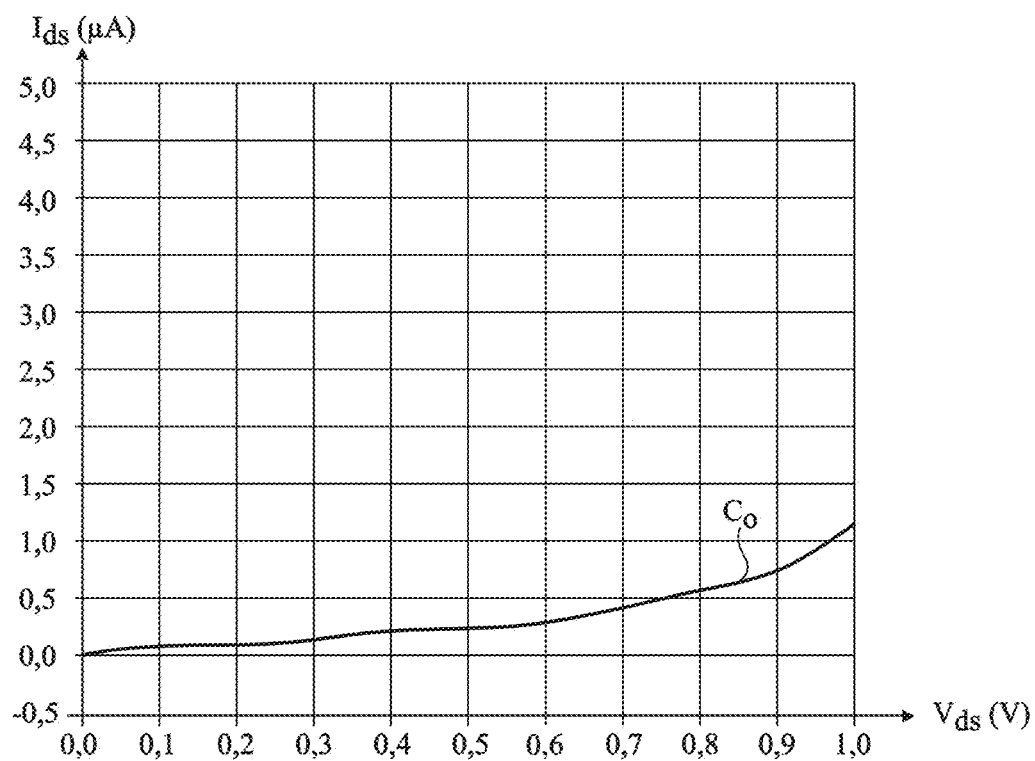
FIGS. 5, 6, and 7 are diagrams illustrating the operation of the MOS transistor of FIG. 4.

FIG. 5 is a diagram showing a curve $C_0$ illustrating the variation of drain-source current $I_{ds}$ (in microamperes, in ordinates) of transistor 301, according to its drain-source voltage $V_{ds}$ (in volts, in abscissas). Curve $C_0$ corresponds to the case where the potential $V_{bg}$ applied to the back side gate (bg) of transistor 301 is zero (that is, substantially equal to the potential of node GND). Further, curve $C_0$ is drawn for a constant voltage $V_{gs}$ between the front side gate (g) and the source (s) of transistor 301, higher than the threshold voltage of the transistor (that is, transistor 301 is biased in saturation state).

As shown in FIG. 5, drain-source current $I_{ds}$ continuously increases from 0 to approximately 1 μA for a voltage $V_{ds}$ increasing from 0 to approximately 1 V. The growth of curve $C_0$ is non-linear, which shows that the output conductance of transistor 301 is dependent on the output voltage $V_{ds}$ of the transistor. It can further be observed that the slope of curve $C_0$ increases with output voltage $V_{ds}$, which shows that the output conductance of transistor 301 degrades (increases) when output voltage $V_{ds}$ increases.

Figure 6:
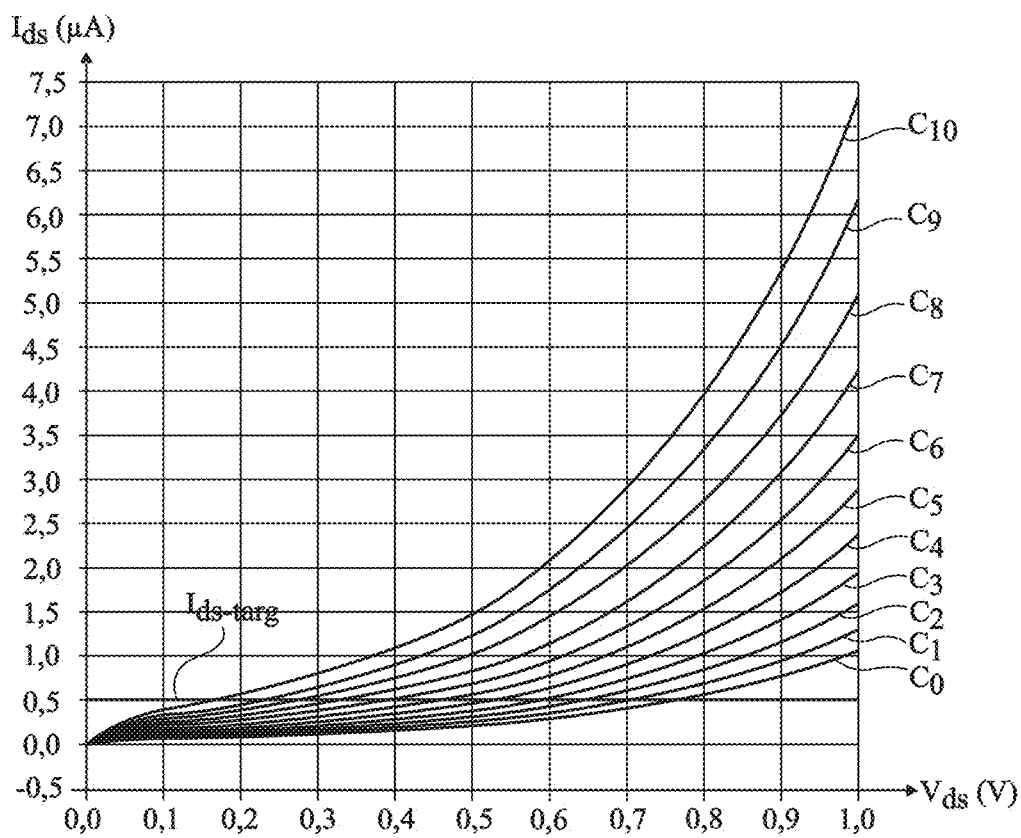

FIG. 6 is a diagram showing, as in FIG. 5, the variation of drain-source current $I_{ds}$ (in microamperes, in ordinates) of transistor 301, according to the drain-source voltage $V_{ds}$ (in volts, in abscissas) of this transistor. FIG. 6 shows curve $C_0$ of the diagram of FIG. 5, as well as curves $C_1$, $C_2$, $C_3$, $C_4$, $C_5$, $C_6$, $C_7$, $C_8$, $C_9$ and $C_{10}$ showing the variation of current $I_{ds}$ according to voltage $V_{ds}$ in the same biasing conditions for the front side gate (g) as in the case of curve $C_0$, but with different potentials $V_{bg}$ applied to the back side gate (bg) of transistor 301. In the shown example, curves $C_1$, $C_2$, $C_3$, $C_4$, $C_5$, $C_6$, $C_7$, $C_8$, $C_9$ and $C_{10}$ respectively correspond to potentials $V_{bg}$ of 0.1 V, 0.2 V, 0.3 V, 0.4 V, 0.5 V, 0.6 V, 0.7 V, 0.8 V, 0.9 V, and 1 V.

As shown in FIG. 6, whatever the bias potential $V_{bg}$ applied to the back side gate of the transistor, drain-source current $I_{ds}$ increases continuously, but not linearly, for a voltage $V_{ds}$ increasing from 0 V to approximately 1 V, with a slope increasing when output voltage $V_{ds}$ increases. Further, in this example, for a given voltage $V_{ds}$, drain-source current $I_{ds}$ is all the higher as potential $V_{bg}$ is high. Indeed, a transistor 301 where an increase of the bias potential applied to the back side gate (bg) of the transistor causes a decrease in the transistor threshold voltage, and thus an increase in the current flowing through the transistor for a given gate-source voltage higher than the transistor threshold voltage, has been considered in this example. In this example, the variation of the threshold voltage of transistor 301 according to the bias potential applied to the back side gate (bg) of the transistor is substantially linear.

Regulation unit 303 of the circuit of FIG. 1 is configured to automatically adjust the potential $V_{bg}$ applied to the back side gate (bg) of transistor 301 according to voltage $V_{ds}$ or to a quantity representative of voltage $V_{ds}$, so that, for a given gate-source voltage $V_{gs}$, drain current $I_{ds}$ of transistor 301 is substantially constant in a range of voltages $V_{ds}$ where the transistor operates in saturation state. This provides a particularly low output conductance (ratio of the resulting variation of current $I_{ds}$ to the corresponding variation of voltage $V_{ds}$), and in particular significantly lower than if transistor 301 was used alone (without regulation unit 303).

To determine the law f of variation of potential $V_{bg}$ according to output voltage $V_{ds}$, enabling to obtain a drain current $I_{ds}$ substantially independent from output voltage $V_{ds}$, a diagram of the type shown in FIG. 6 may be used, and the pairs of voltage $V_{ds}$ and of potential $V_{bg}$ for which current $I_{ds}$ remains equal to a constant target value $I_{ds\text{-}targ}$ can be determined. Target value $I_{ds\text{-}targ}$ may be selected according to the gate-source voltage $V_{gs}$ for which the diagram has been drawn. Law f of variation of potential $V_{bg}$ according to output voltage $V_{ds}$ may be approximated by interpolation, for example, by linear interpolation, based on the determined pairs of values.

Figure 7:
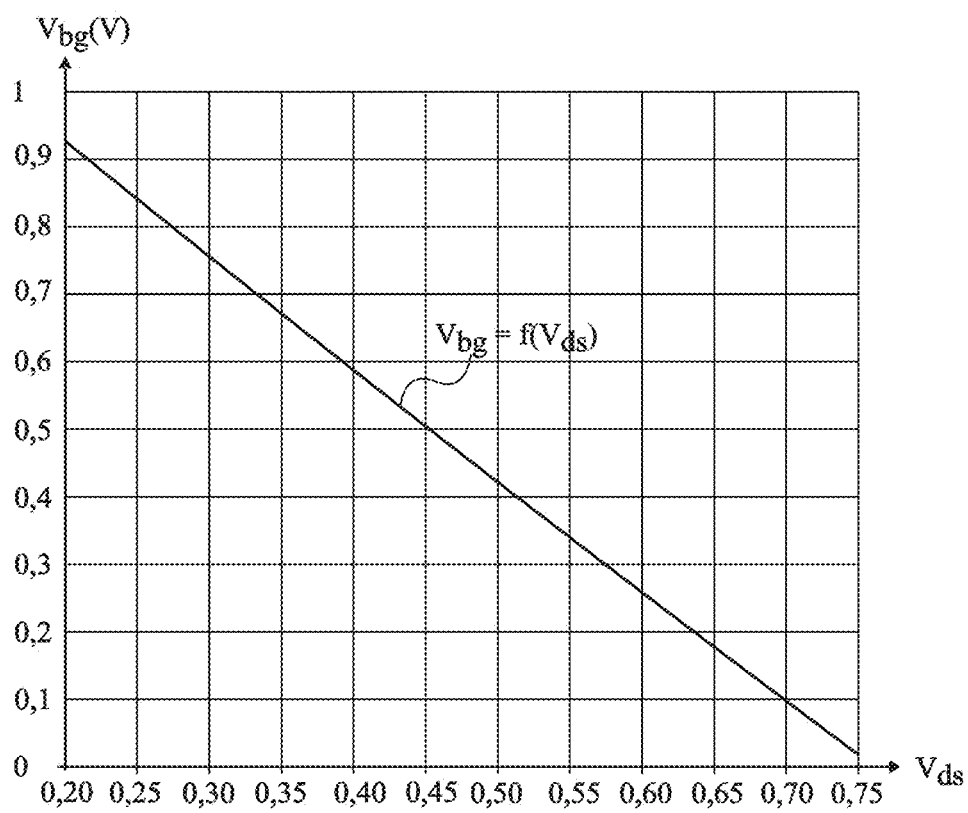

FIG. 7 is a diagram showing law $V_{bg}=f(v_{ds})$ obtained from the curves of the diagram of FIG. 6 for a target value $I_{ds\text{-}targ}$ of current $I_{ds}$ equal to 0.5 μA. Potential $V_{bg}$ and voltage $V_{ds}$ are shown, in voltages, respectively on the axis of ordinates and on the axis of abscissas. As shown in FIG. 7, law f is a quasi-linear decreasing law. More particularly, in the shown example, the potential $V_{bg}$ to be applied to the back side gate (bg) of transistor 301 to maintain a substantially constant drain-source current decreases quasi-linearly from a high value approximately equal to 0.9 V for a voltage $V_{ds}$ in the order of 0.2 V to a low value substantially equal to zero for a voltage $V_{ds}$ in the order of 0.75 V.

Figure 8:
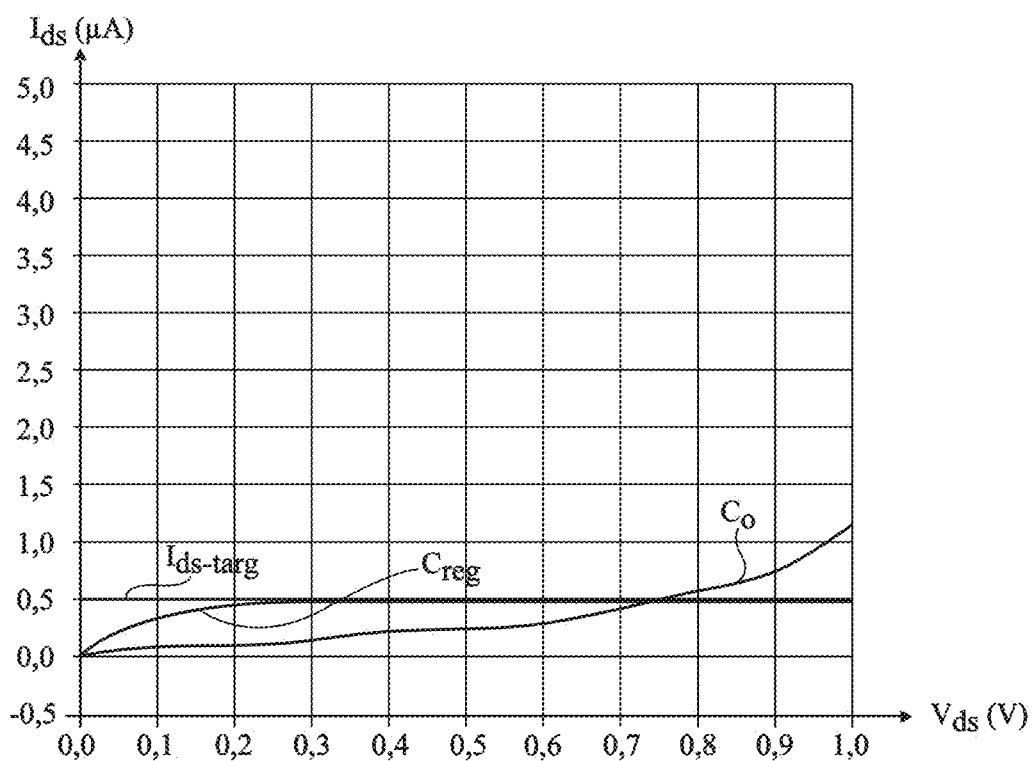
FIG. 8 is a diagram illustrating the operation of the elementary circuit of FIG. 3.

FIG. 8 is a diagram illustrating the behavior of circuit 300 of FIG. 3 when regulation unit 303 applies to the back side gate (bg) of transistor 301 a potential $V_{bg}$ varying according to output voltage $V_{ds}$ of transistor 301 according to law f shown in FIG. 7. More particularly, FIG. 8 comprises a curve $C_{reg}$ showing the variation of drain-source current $I_{ds}$ (in microamperes, in ordinates) of transistor 301, according to drain-source voltage $V_{ds}$ (in volts, in abscissas), of the transistor. Curve $C_{reg}$ is drawn for a constant gate-source voltage $V_{gs}$ equal to the gate-source voltage $V_{gs}$ applied to draw the diagrams of FIGS. 5 and 6 and to determine law f shown in FIG. 7. As a comparison, the diagram of FIG. 8 further comprises the same curve $C_0$ as the diagrams of FIGS. 6 and 7, showing the variation of current $I_{ds}$ according to voltage $V_{ds}$ when a zero potential $V_{bg}$ is applied to the back side gate (bg) of transistor 301. Further, the diagram of FIG. 8 comprises a horizontal line following equation $I_{ds}=I_{ds\text{-}targ}$, showing the target value of current $I_{ds}$ used to determine law f from the diagram of FIG. 6.

As shown in FIG. 8, after a short period of growth (during which transistor 301 operates in ohmic mode) from a zero current value $I_{ds}$ for a zero voltage $V_{ds}$ to a current value $I_{ds}=I_{ds\text{-}targ}$ for a voltage $V_{ds}$ in the order of 0.2 V, curve Creg stabilizes at a substantially constant current value $I_{ds}$, in the order of $I_{ds\text{-}targ}$, over a range of voltages $V_{ds}$ from 0.2 to 1 V. Thus, the output conductance is effectively substantially independent from voltage $V_{ds}$ and has a value smaller than that of transistor 301 alone, over the range of voltages $V_{ds}$ from 0.2 to 1 V. Of course, in practice, once law f has been determined and automatically applied by regulation unit 303, the gate-source voltage $V_{gs}$ applied to transistor 301 may take values different from the value used to determined law f, for example, values representative of an input signal to be amplified or copied by means of transistor 301, and the drain-source current $I_{ds}$ flowing through the transistor may take a value different from target current $I_{ds\text{-}targ}$ selected to define law f.

Law f may be determined on design of elementary circuit 300, for example, by means of a diagram of the type shown in FIG. 6, where the diagram can be obtained by simulation or by measurement, and may comprise a number of curves $C_i$ (corresponding to different potentials $V_{bg}$, i being an integer in the range from 1 to 10 in the example of FIG. 6) different from that of FIG. 6. Law f may be implemented fixedly in regulation unit 303, for example, by means of analog circuits and/or by means of digital circuits. As a variation, law f may be implemented in reconfigurable fashion in regulation unit 303, for example, by means of analog circuits and/or by means of digital circuits. As an example, regulation unit 303 may comprise a calibration unit, not shown, capable of determining the law f to be applied so that transistor 301 has an output conductance substantially independent from its drain-source voltage, and of reconfiguring regulation unit 303 to apply the determined law f. The calibration unit is for example coupled to the source (s) and drain (d) nodes and to the back side gate (bg) of transistor 301, as well as to the front side gate (g) of transistor 301 (by a connection not shown in FIG. 3). During calibration phases, the calibration unit is for example capable of acquiring a series of curves $C_i$ of the type shown in FIG. 6, and then, based on these curves, of determining law f of variation of potential $V_{bg}$ according to voltage $V_{ds}$, enabling to obtain an output conductance substantially independent from voltage $V_{ds}$ in a desired excursion range of voltage $V_{ds}$. To acquire curves $C_i$, the calibration unit may in particular be capable of varying the drain-source voltage $V_{ds}$ applied to transistor 301 and of measuring the drain-source current $I_{ds}$ flowing through transistor 301. The determination of law f may be performed by means of a digital processing unit (not shown). The provision of a reconfigurable regulation unit 303 and of a calibration unit has the advantage of enabling to adjust law f in case of a possible drift for example due to temperature variations, to the aging of transistor 301, or to any other drift factor, for example, a drift of a bias voltage of the transistor.

FIG. 6bis is a diagram showing, as an illustration, curves $C_0'$, $C_1'$, $C_2'$, $C_3'$, $C_4'$, $C_5'$, $C_6'$, $C_7'$, $C_8'$, $C_9'$, $C_{10}'$ similar to curves $C_0$, $C_1$, $C_2$, $C_3$, $C_4$, $C_5$, $C_6$, $C_7$, $C_8$, $C_9$, $C_{10}$ of FIG. 6 for a different operating temperature of transistor 301 and/or for a different state of aging of the transistor and/or for a different bias voltage applied to the front side gate of transistor 301. As shown in FIG. 6bis, curves $C_0'$, $C_1'$, $C_2'$, $C_3'$, $C_4'$, $C_5'$, $C_6'$, $C_7'$, $C_8'$, $C_9'$, $C_{10}'$ representative of the variation of current $I_{ds}$ according to voltage $V_{ds}$ for different values of potential $V_{bg}$ no longer have quite the same shape as curves $C_0$, $C_1$, $C_2$, $C_3$, $C_4$, $C_5$, $C_6$, $C_7$, $C_8$, $C_9$, $C_{10}$ of the example of FIG. 6. During a calibration phase, law f may be updated based on these new curves. The target value $V_{ds\text{-}targ}'$ of current $I_{ds}$ used to determine the new law f may be the same as during the initial calibration or, as shown in FIG.

6bis, a different target value. In the shown example, value $I_{ds\text{-}targ}'$ is in the order of 1 µA. The new law f (not shown) obtained from the curves of FIG. 6bis and for a target value $I_{ds\text{-}targ}'$ in the order of 1 µA is, as in the example of FIG. 7, substantially linear.

FIG. 8bis is a diagram showing, in full lines, curves $C_0$, $C_{reg}$, and $I_{ds\text{-}targ}$ of FIG. 8, and further comprising corresponding curves $C_0'$, $C_{reg}'$, and $I_{ds\text{-}targ}'$, in dashed lines, illustrating the behavior of circuit 300 of FIG. 3 when regulation unit 303 applies to the back side gate (bg) of transistor 301 a potential $V_{bg}$ varying according to output voltage $V_{ds}$ of the transistor according to the new law f determined from the curves of FIG. 6bis. As shown in FIG. 8bis, after a short period of growth (during which transistor 301 operates in ohmic mode), from a zero current value $I_{ds}$ for a zero value $V_{ds}$ up to a current value $I_{ds}=I_{ds\text{-}targ}'$ for a voltage $V_{ds}$ in the order of 0.3 V, curve Creg' stabilizes at a substantially constant current value $I_{ds}$, in the order of $I_{ds\text{-}targ}'$, over a range of voltages $V_{ds}$ from 0.3 to 1 V.

Figure 9:
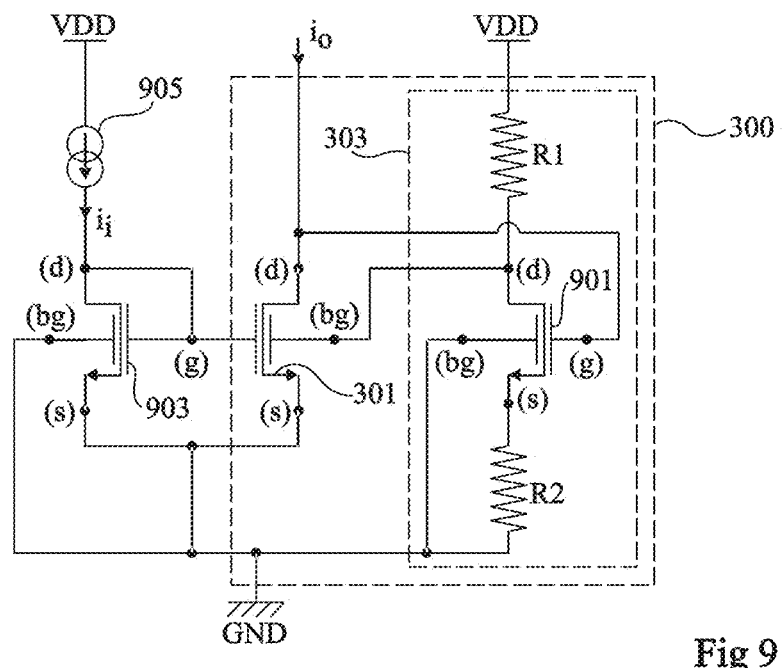
FIG. 9 is an electric diagram of an example of a current copying circuit comprising an elementary circuit of the type described in relation with FIG. 3.

FIG. 9 is an electric diagram of a current copying circuit comprising an elementary circuit 300 of the above-described type. FIG. 9 particularly details an analog embodiment of regulation unit 303 of elementary circuit 300.

Regulation unit 303 comprises a MOS transistor 901, for example, but not necessarily, having the same conductivity type as transistor 301, that is, an N channel in the shown example. In this example, transistor 901 is a dual-gate transistor of same nature as transistor 301. As an example, transistor 901 is identical to transistor 301 (to within manufacturing dispersions). As a variation, transistor 901 may be different from transistor 301. For example, transistor 901 may be a single-gate transistor (that is, comprising no back side gate). As a variation, transistor 901 may have a conductivity type opposite to that of transistor 301 (that, a P channel in this example) and/or have a geometry different from that of transistor 301. Regulation unit 303 further comprises a resistor R1 coupling the drain (d) of transistor 901 to node VDD and a resistor R2 coupling the source (s) of transistor 901 to node GND. The front side gate (g) of transistor 901 is coupled to the drain (d) of transistor 301. In this example, the back side gate (bg) of transistor 901 is coupled to node GND, that is, transistor 901 is used as a single-gate transistor. Further, the drain (d) of transistor 901 is coupled to the back side gate (bg) of transistor 301.

Elementary circuit 300 of FIG. 9 operates as follows. Drain-source voltage $V_{ds}$ of transistor 301 is transferred between the front side gate and the source of transistor 901. Thus, the current flowing through transistor 901 depends on the value of drain-source voltage $V_{ds}$ of transistor 301. This current causes the growth of the source potential of transistor 901 due to the voltage drop across resistor R2. This limits the growth of the current flowing through transistor 901. It can be shown that if the product of transconductance gm of transistor 901 by the value of resistance R2 is large as compared with 1, then the drain-source current of transistor 901 varies substantially linearly according to drain-source voltage $V_{ds}$ of transistor 301. As a result, the potential of the drain node (d) of transistor 901 varies substantially linearly according to drain-source voltage $V_{ds}$ of transistor 301. The drain node (d) of transistor 901 being connected to the back side gate (bg) of transistor 301, potential $V_{bg}$ applied to the back side gate (bg) of transistor 301 (referenced to node GND) varies linearly according to drain-source voltage $V_{ds}$ of transistor 301. More particularly, the law of the variation of potential $V_{bg}$ of transistor 301 according to voltage $V_{ds}$ of transistor 301 is a linear decreasing law having its ordinate at the origin and its slope depending on the values of resistances R1 and R2. Resistors R1 and R2 are for example selected to obtain a law f of the type shown in the diagram of FIG. 7. As a variation, resistors R1 and R2 may be replaced with programmable resistors or transistors, which enables to make regulation unit 303 reconfigurable.

The current copying circuit of FIG. 9 further comprises a MOS transistor 903 of the same conductivity type as transistor 301, that is, with an N channel in the shown example. In this example, transistor 903 is a dual-gate transistor of same nature as transistor 301. Transistor 903 is for example identical to transistor 301 (to within manufacturing dispersions). As a variation, transistor 903 is a transistor having the same gate length and the same gate insulator thickness as transistor 301, but a different gate width.

Transistors 903 and 301 are assembled as a current mirror. Transistor 903 forms the input branch of the current mirror and transistor 301 forms the output branch of the current mirror. More particularly, the source (s) of transistor 903 is connected to the source (s) of transistor 301, the front side gate (g) of transistor 903 is coupled to the front side gate (g) of transistor 301, and the drain (d) of transistor 903 is connected to the front side gate (g) of transistor 903. In this example, the sources (s) of transistors 903 and 301 are connected to node GND and the drain (d) of transistor 903 is coupled to node VDD via a current source 905 delivering current $i_i$ to be copied. Further, in this example, the back side gate (bg) of transistor 903 is coupled to node GND.

The circuit of FIG. 9 operates as follows. When a drain-source $i_i$ is applied to transistor 903, for example, by current source 905, the front side gate (g) of transistor 903 self-biases so that transistor 903 absorbs current $i_i$. Output transistor 301 being biased to the same gate-source voltage as input transistor 903, transistor 301 conducts an output current $i_o$ substantially identical to input current $i_i$ (or proportional to input current $i_i$ if transistors 903 and 301 have different dimensions). In this example, the drain node (d) of transistor 301 forms an output node of the current copying circuit. Regulation unit 303 enables the output conductance of transistor 301 to be relatively low and to be substantially independent from the drain-source voltage of this transistor, that is, from the output voltage of the circuit. As a result, the circuit of FIG. 9 enables to very accurately copy input current $i_i$.

Figure 10:
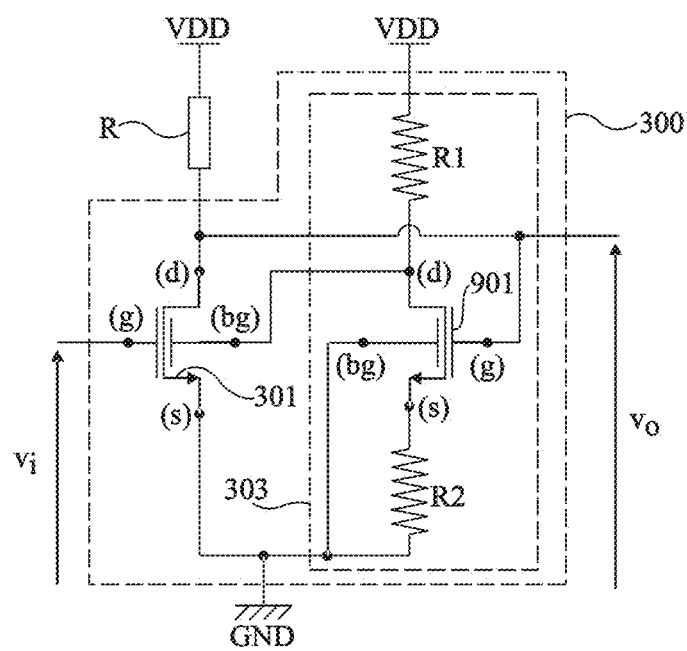
FIG. 10 is an electric diagram of an example of a voltage amplification circuit comprising an elementary circuit of the type described in relation with FIG. 3.

FIG. 10 is an electric diagram of a voltage amplification circuit comprising an elementary circuit 300 of the type described in relation with FIG. 3.

Elementary circuit 300 of the circuit of FIG. 10 is identical to the elementary circuit 300 of the circuit of FIG. 9. In the circuit of FIG. 10, the source (s) of transistor 301 is coupled to node GND. As a variation, the source (s) of transistor 301 may be coupled to a node of application of a reference potential different from potential GND. For example, the source (s) may be coupled to node GND via a resistor (not shown). The circuit of FIG. 10 further comprises a resistive load R, for example, a resistor or one or a plurality of MOS transistors, or also one or a plurality of circuits 300 of the type described in relation with FIG. 3, coupling the drain (d) of transistor 301 to node VDD.

The circuit of FIG. 10 operates as follows. When an input voltage $v_i$ to be amplified (referenced to node GND in this example) is applied to the front side gate (g) of transistor 301, the circuit of FIG. 10 supplies, on the drain node (d) of transistor 301, an output voltage $v_o$ (also referenced to node GND in this example) which is an amplified image of voltage $v_i$. In small signals, the voltage gain $G_v=v_o/v_i$ of the circuit is in the order of $-G_m*R_{out}$, $G_m$ being the transconductance of transistor 301, and $R_{out}$ being the equivalent resistance between the resistance of load R and the output resistance $R_{ds}$ of transistor 301, placed in parallel in the small-signal equivalent assembly. Output resistance $R_{ds}$ of transistor 301 is equal to the inverse of its output conductance ($R_{ds}=1/g_{ds}$) Assuming R to be large as compared with $R_{ds}$, the voltage gain of the circuit may be approximated by Gv=−Gm*Rds=−Gm/gds. Regulation unit 303 enables the output conductance of transistor 301 to be relatively low and substantially independent from the drain-source voltage of this transistor, that is, from the output voltage of the circuit. As a result, the circuit of FIG. 10 enables to achieve a faithful amplification of input voltage $v_i$, with a high voltage gain due to the decrease of the output conductance of the assembly.

Figure 11:
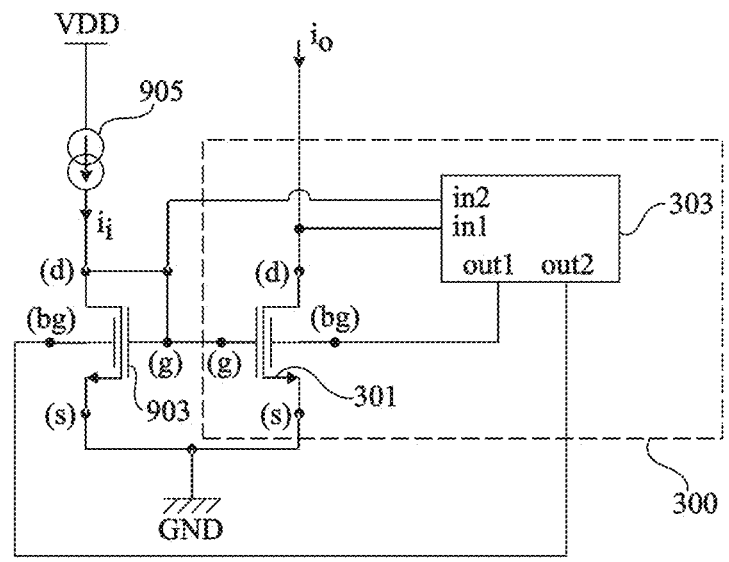
FIG. 11 is an electric diagram of another example of a current copying circuit comprising an elementary circuit of the type described in relation with FIG. 3.

FIG. 11 is an electric diagram of another example of a current copying circuit comprising an elementary circuit 300 of the above-described type. The circuit of FIG. 11 differs from the circuit of FIG. 9 mainly in that, in the example of FIG. 11, regulation unit 303 of circuit 300 not only regulates the potential of the back side gate of transistor 301, but further regulates the potential of the back side gate of transistor 903. Further, to perform the regulation, unit 303 may take into account not only the drain-source voltage of transistor 301, but also the drain-source voltage of transistor 903. This enables to further improve the accuracy of the copying of current $i_i$ and thus to obtain a particularly low output conductance. In FIG. 11, regulation unit 303 has not been detailed, and is schematized by a block comprising an input in1 coupled to the drain node of transistor 301, monitoring the drain-source voltage of transistor 301, an input in2 coupled to the drain node of transistor 903, monitoring the drain-source voltage of transistor 903, an output out1 coupled to the back side gate of transistor 301, regulating the potential applied to the back side gate of transistor 301, and an output out2 coupled to the back side gate of transistor 903, regulating the potential applied to the back side gate of transistor 903. As a (non limiting) example, outputs out1 and out2 of the regulation unit may be confounded, that is, the same potential may be applied to the back side gate of transistor 301 and to the back side gate of transistor 903. As a variation, only the potential of the back side gate of transistor 903 may be regulated by regulation unit 303. The potentials applied to the back side gates of transistors 301 and 903 may be defined by a same law f taking into account signals in1 and in2 (out1=out2=f(in1, in2)), or by a same law f taking into account signal M1 only for transistor 301 and signal in2 only for transistor 903 (out1=f(in1) and out2=f(in2)), or by different laws f1 and f2 respectively taking into account signal in1 for transistor 301 and signal in2 for transistor 903 (out1=f1(in1) and out2=f2 (in2)), or by different laws f1 and f2 each taking into account signals in1 and in2 (out1=f1(in1,in2) and out2=f2(in1,in2)). As a variation, only the potential applied to the back side gate of transistor 301 is regulated, by a law f taking into account the signal in1 only (out1=f(in1)) or by a law f taking into account signals in1 and in2 (out1=f(in1,in2)). In another variation, only the potential applied to the back side gate of transistor 903 is regulated, by a law f taking into account the signal in1 only (out1=f(in1)) or by a law f taking into account signals in1 and in2 (out2=f(in1,in2)).

Figure 12:
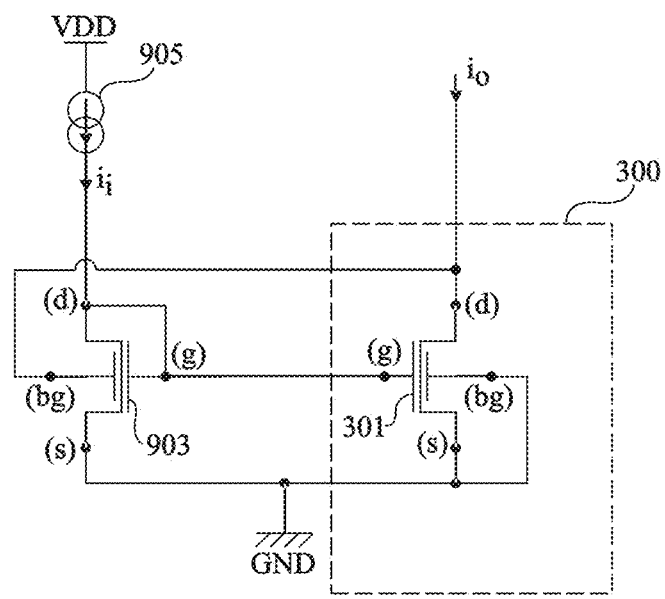
FIG. 12 is an electric diagram of an embodiment of the current copying circuit of FIG. 11.

FIG. 12 is an electric diagram of an example of implementation of the circuit of FIG. 11. FIG. 11 particularly details an example of analog implementation of regulation unit 303 of elementary circuit 300.

In this example, regulation unit 303 (not referenced in FIG. 12) is formed by a simple wire (or conductive track) connecting the drain of transistor 301 to the back side gate (bg) of transistor 903. Further, in this example, the back side gate (bg) of transistor 301 is connected to node GND. In other words, in the example of FIG. 12, using the notations of FIG. 11, regulation unit 303 has its input node in1 connected to its output node out2, its output node out1 connected to node GND, and its input node in2 unused (not connected).

Elementary circuit 300 of FIG. 12 operates as follows. The voltage applied to the back side gate of transistor 903 follows the drain-source voltage of transistor 301 which may for example vary between 0 and 1 V. When the drain-source voltage of transistor 301 increases, the threshold voltage of transistor 903 accordingly decreases, whereby the gate-source voltage applied to the two transistors of the mirror decreases to maintain output current $i_o$, that is, the drain current of transistor 301, substantially identical to input current $i_i$ (or proportional to current $i_i$ if transistors 903 and 301 have different dimensions).

The slope of the curve of variation of output current $i_o$ according to the drain-source voltage of transistor 301 may be controlled by varying the channel length (or gate length) of transistors 301 and 903. As an example, the channel length of transistors 903 and 301 is selected so that this slope is substantially horizontal in a range of drain-source voltages of transistor 301, that is, so that current $i_o$ is substantially independent from the drain-source voltage of transistor 301 in this operating range, to obtain a relatively small output conductance of transistor 301 (as compared with an assembly comprising no back side gate regulation).

Figure 13:
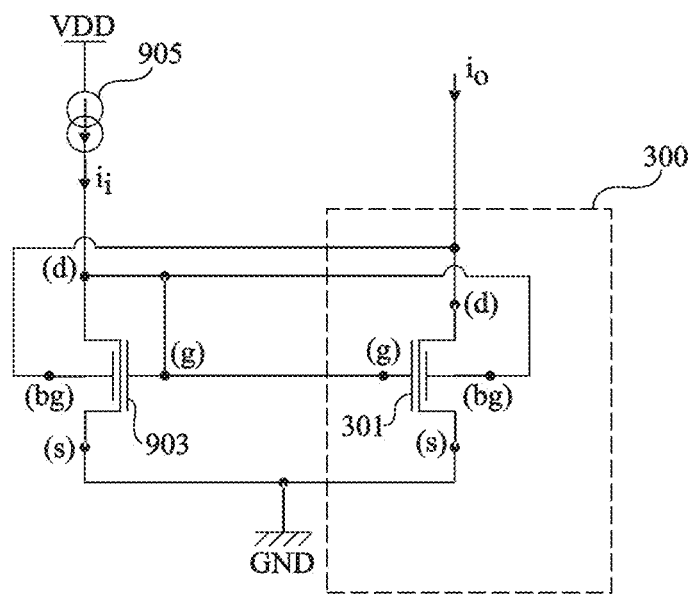
FIG. 13 is an electric diagram of another embodiment of the current copying circuit of FIG. 11.

FIG. 13 is an electric diagram illustrating an alternative embodiment of the circuit of FIG. 12.

The circuit of FIG. 13 differs from the circuit of FIG. 12 in that, in the circuit of FIG. 13, the back side gate (bg) of transistor 301, instead of being connected to node GND, is connected to the drain (d) of transistor 903. In other words, in this example, using the notations of FIG. 11, regulation unit 303 has its input node in1 connected to its output node out2 and its input node in2 connected to its output node out1.

In the variation of FIG. 13, the assembly of the two transistors 903 and 301 is symmetrical, whereby the two transistors behave in the same way.

The embodiments of FIGS. 12 and 13 apply in all modes of moderate and low inversion of transistors 903 and 301. The drain voltage of transistor 301 controls the back side gate of transistor 903 to decrease the voltage of the front side gate common to the two transistors when the drain voltage of transistor 301 increases, which results in decreasing the output conductance of transistor 301 with respect to an assembly comprising no back side gate regulation. Varying the size, and more particularly the gate length, of the transistors enables to modify the output conductance and the transconductance of the transistors. There exists a gate length for which the transconductance compensates for the output conductance. Beyond this gate length, a strong negative output resistance can be obtained.

Figure 14:
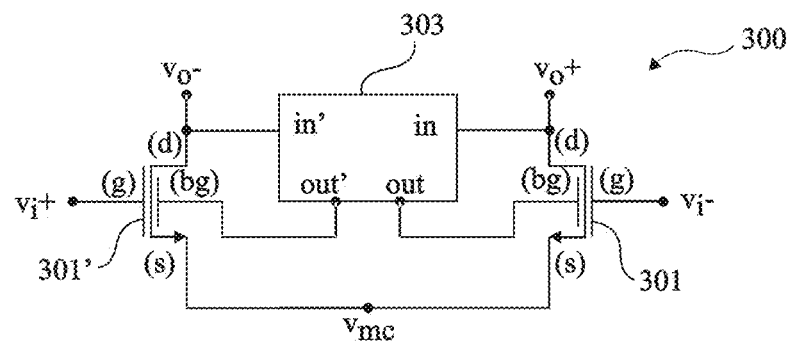
FIG. 14 is an electric diagram of another example of a voltage amplification circuit comprising an elementary circuit of the type described in relation with FIG. 3.

FIG. 14 is an electric diagram of another example of a voltage amplification circuit comprising an elementary circuit of the type described in relation with FIG. 3.

The circuit of FIG. 14 is a differential voltage amplification circuit. The circuit of FIG. 14 differs from the circuit of FIG. 10 essentially in that, in the circuit of FIG. 14, elementary circuit 300 is of differential type. More particularly, in the example of FIG. 14, elementary circuit 300 comprises the same elements as in the example of FIG. 3 and further comprises a transistor 301' identical or similar to transistor 301. The source (s) of transistor 301' is coupled to the source (s) of transistor 301 at a common-mode node $v_{mc}$.

Common-mode node $v_{mc}$ is for example coupled to a current source, not shown in FIG. 14, powering the differential transistor pair. In the example of FIG. 14, regulation unit 303 regulates the potential of the back side gate of transistor 301 according to the drain-source voltage of this transistor, and regulates the potential of the back side gate of transistor 301' according to the drain-source voltage of this transistor. In FIG. 14, regulation unit 303 has not been detailed and is schematized by a block comprising an input in coupled to the drain node of transistor 301, monitoring the drain-source voltage of transistor 301, an input in' coupled to the drain node of transistor 301', monitoring the drain-source voltage of transistor 301', an output out coupled to the back side gate of transistor 301, regulating the potential applied to the back side gate of transistor 301, and an output out' coupled to the back side gate of transistor 301', regulating the potential applied to the back side gate of transistor 301'. More generally, the potentials applied to the back side gates of transistors 301 and 301' may be defined by a same law f taking into account signals in and in' (out=out'=f(in,in')) or by a same law f taking into account signal in only for transistor 301 and signal in' only for transistor 301' (out=f (in) and out'=f(in')), or by different laws f and f' respectively taking into account signal in for transistor 301 and of signal in' for transistor 301' (out=f(in) and out'=f'(in')), or by different laws f and f' each taking into account signals in and in' (out=f(in,in') and out'=f'(in,in')).

The high $v_i+$ and low $v_i-$ potentials of the differential voltage to be amplified are respectively applied to the gate node (g) of transistor 301' and to the gate node (g) of transistor 301. The high $v_o+$ and low $v_o-$ potentials of the amplified differential output voltage of the circuit are respectively supplied onto the drain node (d) of transistor 301 and onto the drain node (d) of transistor 301'. The high and low potentials $v_o+$ and $v_o-$ of the amplified differential output voltage of the circuit may be generated by charge transistors or resistors, not shown in FIG. 14, respectively placed between the drains of transistors 301 and 301' and a high power supply. As an example, the high power supply is potential VDD.

Figure 2:
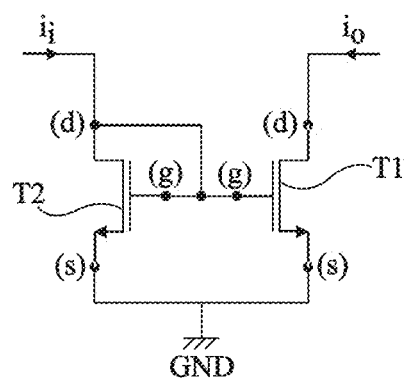
FIG. 2, previously described, is an electric diagram of an example of a current copying circuit.

It should be noted that, conversely to the cascode assembly, elementary circuit 300 has the advantage of not limiting, as compared with circuits of the type described in relation with FIGS. 1 and 2, the excursion range of the output voltages where the proper operation of the circuit is guaranteed.

Specific embodiments have been described. Various alterations and modifications will occur to those skilled in the art. In particular, although an embodiment where the dual-gate MOS transistor 301 of elementary circuit 300 is an N-channel transistor has been described, the described embodiments may be implemented with a P-channel transistor. It will be within the abilities of those skilled in the art to adapt the described examples to obtain the desired operation.

Further, although an embodiment for which transistor 301 has a threshold voltage linearly decreasing according to the bias potential $V_{bg}$ applied to its back side gate (bg) has been described, the described embodiments are not limited to this specific case. It will be within the abilities of those skilled in the art to implement the desired operation, and particularly to determine the law f enabling to obtain an output conductance substantially independent from the drain-source voltage of transistor 301 in the case where the threshold voltage of transistor 301 increases when potential $V_{bg}$ increases and/or in the case where the variation of the threshold voltage of transistor 301 according to potential $V_{bg}$ is non-linear. More generally, it will be within the abilities of those skilled in the art to adapt the described embodiments to all types of multi-gate transistors, and particularly to transistors having a number of gates greater than two.

Further, the described embodiments are not limited to the embodiment of regulation unit 303 described in relation with FIG. 9. In particular, other analog circuits capable of automatically regulating potential $V_{bg}$ of transistor 301 according to its drain-source voltage may be provided. Further, regulation unit 303 may be made in digital form. As an example, regulation unit 303 may comprise a circuit for sampling and digitizing drain-source voltage $V_{ds}$ of transistor 301, a digital circuit capable of determining, according to the measured value of voltage $V_{ds}$, and using law f, the potential $V_{bg}$ to be applied to the back side gate of transistor 301, and a digital-to-analog conversion circuit enabling to apply to transistor 301 the determined potential $V_{bg}$. For example, law f may be stored in the digital circuit for determining potential $V_{bg}$, in the form of an analytic formula, or in the form of a lookup table.

Further, the described embodiments are not limited to the case where regulation unit 303 is directly connected to the source and to the drain of transistor 301. As a variation, the regulation unit, instead of directly measuring drain-source voltage $V_{ds}$ of transistor 301, may measure another quantity representative of voltage $V_{ds}$ and deduce from this quantity, using law f, the potential $V_{bg}$ to be applied to the back side gate of transistor 301 (and/or of transistor 903).

Further, regulation unit 303 may be shared by a plurality of transistors 301. It is then assumed that the different transistors 301 all substantially have the same drain-source voltage $V_{ds}$ and a same potential $V_{bg}$ is applied to the back side gates of the different transistors 301. In this case, regulation unit 303 may be coupled to the source (s) and to the drain (d) of a single transistor 301, and be coupled to the back side gates (bg) of a plurality of transistors 301 (or 903). Such an operating mode is for example well adapted to applications where a plurality of identical or similar circuits, for example, analog signal copying or amplification circuits, are coupled in parallel.

Further, the described embodiments are not limited to the examples of application described in relation with FIGS. 9 and 10. More generally, the provided elementary circuit 300 may be used in many circuits using MOS transistors operating in saturation state to copy or amplify analog signals, for example, voltage-to-voltage amplifiers, voltage-to-current amplifiers, current-to-voltage amplifiers, or current-to-current amplifiers. In particular, the provided elementary circuit 300 may be used to form differential analog signal copying or amplification circuits. Further, elementary circuit 300 may be used for other applications than for the amplification and/or the copying of analog signals.

Further, the described embodiments are not limited to the above-described examples where regulation unit 303 comprises one or two inputs and one or two outputs. More generally, the regulation unit may have n inputs inj, where n is any integer greater than or equal to 1 and j is an integer in the range from 1 to n, and m outputs outk, where m is any integer greater than or equal to 1 and k is an integer in the range from 1 to m. Each input inj receives a signal representative of the drain-source voltage of a dual-gate MOS transistor. Each input inj is for example coupled to a drain node of a dual-gate MOS transistor. The signal supplied by each output outk is used to regulate the potential of the back side gate of a dual-gate MOS transistor. Each output outk is for example coupled to the back side gate of a dual-gate MOS transistor. The signal supplied on each output outk may be determined as follows according to a law fk taking into account at least one of the input signals:

$$\text{out1} = f1(\text{in1}, \text{in2}, \ldots, \text{inn}),$$

$$\text{out2} = f2(\text{in1}, \text{in2}, \ldots, \text{inn}),$$

$$\ldots$$

$$\text{outm} = fm(\text{in1}, \text{in2}, \ldots, \text{inn}).$$

Further, the described embodiments are not limited to the above-mentioned examples of methods of determining law f, based on the acquisition of a bundle of curves $C_0$, $C_1$, $C_2$, ... etc., of the type described in relation with FIG. 6, and then on the interpolation, based on this batch of curves, of a regulation law f of the type illustrated in FIG. 7. More generally, other methods of determining law f may be provided, for example, indirect determination methods, for example, methods based on the maximizing of the gain when the transistor is assembled as an amplifier. As an example, in the assembly of FIG. 10, the object which is desired to be achieved by applying a regulation to the back side gate of transistor 301 is to maximize the voltage gain of the amplifier. Without going through the steps of acquisition of a batch of curves of the type shown in FIG. 6 and through the extraction of a regulation law f of the type shown in FIG. 7, it is possible to optimize the selection of resistors of R1 and R2 of the assembly to maximize its voltage gain $G_v = v_o/v_i$. In the case where resistors R1 and R2 are programmable resistors, their values may be readjusted during subsequent calibration phases, to take into account possible drifts and/or modifications of the conditions of use of the assembly.

The invention claimed is:

1. An electronic circuit comprising:
at least one first multi-gate MOS transistor comprising a first gate and a second gate different from the first gate; and
a regulation unit comprising analog circuits and/or digital circuits, configured for applying to the second gate of the first transistor a bias potential which is a function of a quantity representative of a drain-source voltage of the first transistor,
wherein variations of the bias potential applied by the regulation unit according to variations of the drain-source voltage of the first transistor follow a law selected so that, in a range of drain-source voltages where the first transistor operates in saturation state, an output conductance of the first transistor is smaller than when a constant bias potential is applied to the second gate of the first transistor.

2. The circuit of claim 1, wherein the variations of the bias potential applied by the regulation unit according to the variations of the drain-source voltage of the first transistor follow a law selected so that, in said range of drain-source voltages where the first transistor operates in saturation state, the output conductance of the first transistor is substantially independent from its drain-source voltage.

3. The circuit of claim 1, wherein the variations of the bias potential applied by the regulation unit according to the variations of the drain-source voltage of the first transistor follow a law selected so that, for a given voltage applied between the first gate and a source of the first transistor, a drain-source current of the first transistor is substantially constant in said range of drain-source voltages where the first transistor operates in saturation state.

4. The circuit of claim 1, wherein the first transistor comprises a channel-forming region, a source region, and a drain region laterally bordering the channel-forming region, the first gate being arranged above the channel-forming region and being insulated from the channel-forming region by an insulating layer, and the second gate being arranged under the channel-forming region.

5. The circuit of claim 4, wherein the second gate is insulated from the channel-forming region by an insulating layer.

6. The circuit of claim 1, wherein the first transistor is a FDSOI-type transistor.

7. The circuit of claim 1, wherein the regulation unit comprises a second MOS transistor comprising:
a gate coupled to a drain of the first transistor;
a drain coupled to a node of application of a first power supply potential by a first resistor;
a source coupled to a node of application of a second power supply potential different from the first power supply potential by a second resistor.

8. The circuit of claim 1, wherein the regulation unit comprises digital circuits.

9. The circuit of claim 1, comprising a plurality of first multi-gate MOS transistors each comprising a first gate and a second gate different from the first gate, wherein the regulation unit is capable of measuring, for each first transistor, a quantity representative of the drain-source voltage of the transistor, and of applying to the second gate of each first transistor a bias potential which is a function of one or a plurality of said quantities.

10. The circuit of claim 1, wherein the regulation unit comprises a calibration unit capable of determining the law of the variations to be applied to the bias potential according to the variations of the drain-source voltage of the first transistor so that, in saturation state, the output conductance of the first transistor is smaller than when a constant bias potential is applied to the second gate of the first transistor.

11. The circuit of claim 10, wherein the regulation unit is reconfigurable, the calibration unit being capable of configuring the regulation unit to apply the determined law.

12. The circuit of claim 1, wherein the regulation unit comprises a calibration unit capable of determining the law of the variations to be applied to the bias potential according to the variations of the drain-source voltage of the first transistor so that, in saturation state, the output conductance of the first transistor is substantially independent from its drain-source voltage.

13. The circuit of claim 1, wherein the regulation unit comprises a third multi-gate MOS transistor comprising a first gate and a second gate different from the first gate, the first and third transistors being assembled as a current mirror, and the second gate of the first transistor being connected to a drain of the third transistor.

14. The circuit of claim 13, wherein the second gate of the third transistor is connected to a drain of the first transistor.

15. An analog signal amplification circuit comprising at least one circuit of claim 1.

16. A current copying circuit, comprising at least one circuit of claim 1.

17. A differential signal amplification or copying circuit comprising at least one circuit of claim 1.

* * * * *